United States Patent
Jeong et al.

(10) Patent No.: US 7,119,425 B2
(45) Date of Patent: Oct. 10, 2006

(54) STACKED MULTI-CHIP SEMICONDUCTOR PACKAGE IMPROVING CONNECTION RELIABILITY OF STACKED CHIPS

(75) Inventors: Se-Young Jeong, Seoul (KR); Kang-Wook Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/089,361

(22) Filed: Mar. 25, 2005

(65) Prior Publication Data

US 2005/0285250 A1 Dec. 29, 2005

(30) Foreign Application Priority Data

Jun. 24, 2004 (KR) .................. 10-2004-0047659

(51) Int. Cl.
*H01L 23/02* (2006.01)
*H01L 23/48* (2006.01)

(52) U.S. Cl. .............. 257/685; 257/686; 257/723; 257/777; 257/E25.006; 257/E25.013; 257/E25.021; 257/E25.027; 257/E23.085

(58) Field of Classification Search ............ 257/685, 257/686, 723, 777, E25.006, E25.013, E25.027, 257/E23.085
See application file for complete search history.

(56) References Cited

U.S. PATENT DOCUMENTS

| 4,394,712 | A | * | 7/1983 | Anthony | .................. 361/779 |
| 5,229,647 | A | * | 7/1993 | Gnadinger | .................. 257/785 |
| 5,404,044 | A | * | 4/1995 | Booth et al. | ............... 257/698 |
| 5,682,062 | A | * | 10/1997 | Gaul | .................. 257/686 |
| 6,087,719 | A | * | 7/2000 | Tsunashima | .............. 257/686 |
| 6,236,115 | B1 | * | 5/2001 | Gaynes et al. | .............. 257/774 |
| 6,239,495 | B1 | * | 5/2001 | Sakui et al. | ................. 257/777 |
| 6,429,509 | B1 | | 8/2002 | Hsuan | |
| 6,577,013 | B1 | * | 6/2003 | Glenn et al. | ................ 257/777 |
| 6,624,506 | B1 | * | 9/2003 | Sasaki et al. | ............... 257/686 |
| 6,791,175 | B1 | * | 9/2004 | Matsuo et al. | .............. 257/686 |
| 6,809,421 | B1 | * | 10/2004 | Hayasaka et al. | ............ 257/777 |
| 6,989,589 | B1 | * | 1/2006 | Hammadou et al. | ........ 257/685 |
| 2002/0017710 | A1 | * | 2/2002 | Kurashima et al. | ......... 257/686 |
| 2002/0036338 | A1 | * | 3/2002 | Matsuo et al. | .............. 257/686 |
| 2003/0107119 | A1 | * | 6/2003 | Kim | .......................... 257/686 |
| 2005/0051883 | A1 | * | 3/2005 | Fukazawa | .................... 257/686 |
| 2005/0269680 | A1 | * | 12/2005 | Hsuan | ......................... 257/686 |

FOREIGN PATENT DOCUMENTS

| KR | 10-0253397 | 1/2000 |
| KR | 10-0345166 | 7/2002 |

\* cited by examiner

*Primary Examiner*—Jasmine Clark
(74) *Attorney, Agent, or Firm*—Harness, Dickey & Pierce, P.L.C.

(57) ABSTRACT

The chip package includes a first and second semiconductor chip. The first semiconductor chip has a first connection structure that electrically connects to a bond pad on a first surface of the first semiconductor chip. The second semiconductor chip has a second connection structure. The second connection structure is electrically connected to a bond pad on a first surface of the second semiconductor chip and extends through the second semiconductor chip to a second surface of the second semiconductor chip. A portion of the second connection structure extending to the second surface of the second semiconductor chip is electrically connected to the first connection structure and formed of a harder material than the first connection structure.

24 Claims, 6 Drawing Sheets

STACKED MULTI-CHIP SEMICONDUCTOR PACKAGE IMPROVING CONNECTION RELIABILITY OF STACKED CHIPS

BACKGROUND OF THE INVENTION

This application claims priority on Korean Patent Application No. 2004-47659, filed on Jun. 24, 2004, in the Korean Intellectual Property Office, the disclosure of which is incorporated by reference herein in its entirety by.

1. Field of the Invention

The present invention relates to a semiconductor package, and more particularly, to a multi-chip semiconductor package having a stacked structure.

2. Description of the Related Art

As the size of electronic products has decreased and the demand for high performance, portable mobile products has increased, the demand for ultra-slim large-capacity semiconductor memories has increased over time. In general, in order to increase the storage capacity of a semiconductor memory, integration of a semiconductor chip can be increased or several semiconductor chips can be assembled as one semiconductor package. In the former case, much effort, capital resources and time are required. However, in the latter case, the storage capacity of the semiconductor memory may be increased by changing only a method of packaging. In addition, in the latter case, since less capital resources, effort in research and development and time are required for development than those in the former case, semiconductor memory manufacturers have endeavored to increase a storage capacity of a semiconductor memory device using a multi-chip semiconductor package formed by inserting several semiconductor chips into one semiconductor package. A plurality of semiconductor chips can be inserted into one semiconductor package both in a horizontal direction and a vertical direction.

SUMMARY OF THE INVENTION

The present invention provides a stacked semiconductor chip package.

In one embodiment, the package includes a first and second semiconductor chip. The first semiconductor chip has a first connection structure that electrically connects to a bond pad on a first surface of the first semiconductor chip. The second semiconductor chip has a second connection structure. The second connection structure is electrically connected to a bond pad on a first surface of the second semiconductor chip and extends through the second semiconductor chip to a second surface of the second semiconductor chip. A portion of the second connection structure extending to the second surface of the second semiconductor chip is electrically connected to the first connection structure and formed of a harder material than the first connection structure. For example, the first connection structure may include one of Sn, SnPb, SnAg, SnAgCu, SnBi, In and InSn, and the second connection structure may include one of Cu, Ni, Ni—P, Au, and Ag.

In another embodiment, the chip package may include a base frame, and the first connection structure extends through the first semiconductor chip to a second surface of the first semiconductor chip such that first connection structure is electrically connected to the base frame.

In another embodiment, a part of the portion of the second connection structure extending to the second surface of the second semiconductor chip protrudes from the second surface of the second semiconductor chip. A portion of the protruding part may extend into the first connection structure.

In a further embodiment, the package includes a first and second semiconductor chip package. The first semiconductor chip has a first connection structure, and the first connection structure is electrically connected to a bond pad on a first surface of the first semiconductor chip. The second semiconductor chip has a second connection structure, and the second connection structure is electrically connected to a bond pad on a first surface of the second semiconductor chip. The second connection structure extends through the second semiconductor chip to a second surface of the second semiconductor chip. A portion of the second connection structure protrudes from the second surface of the second semiconductor chip, and a portion of the protruding portion extends into the first connection structure such that the first and second connection structures are electrically connected.

As will be appreciated with respect to any of the above described embodiments, additional semiconductor chips may be stacked on the second semiconductor chip; wherein each additional semiconductor chip has one of the first and second connection structures.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings in which exemplary embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art.

Figure 1:
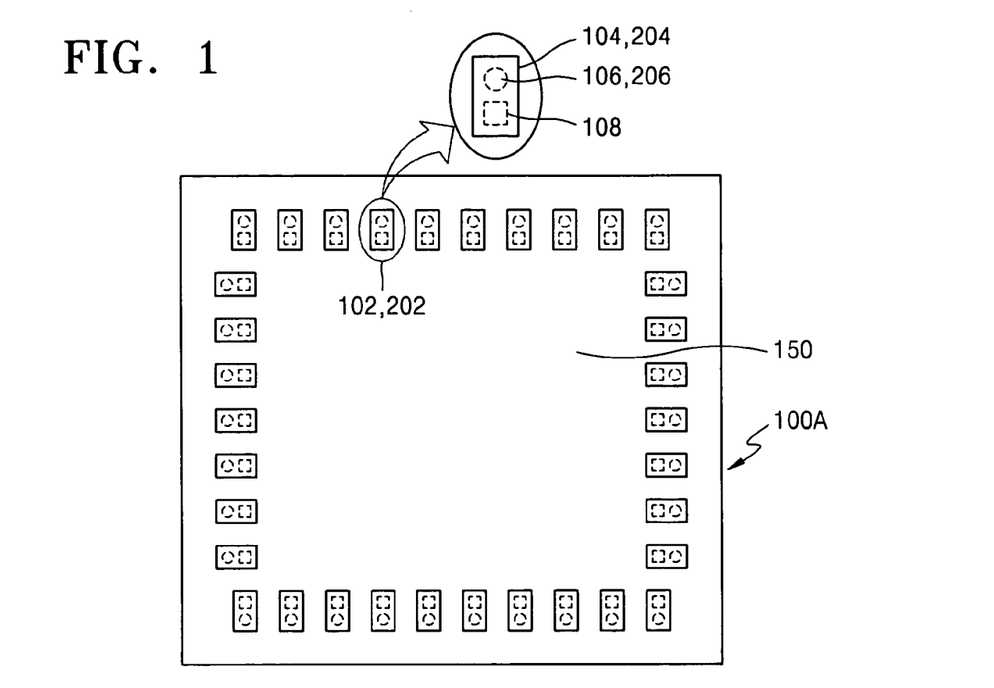
FIGS. 1 and 2 are plane views of semiconductor chips according to embodiments of the present invention.
Figure 2:
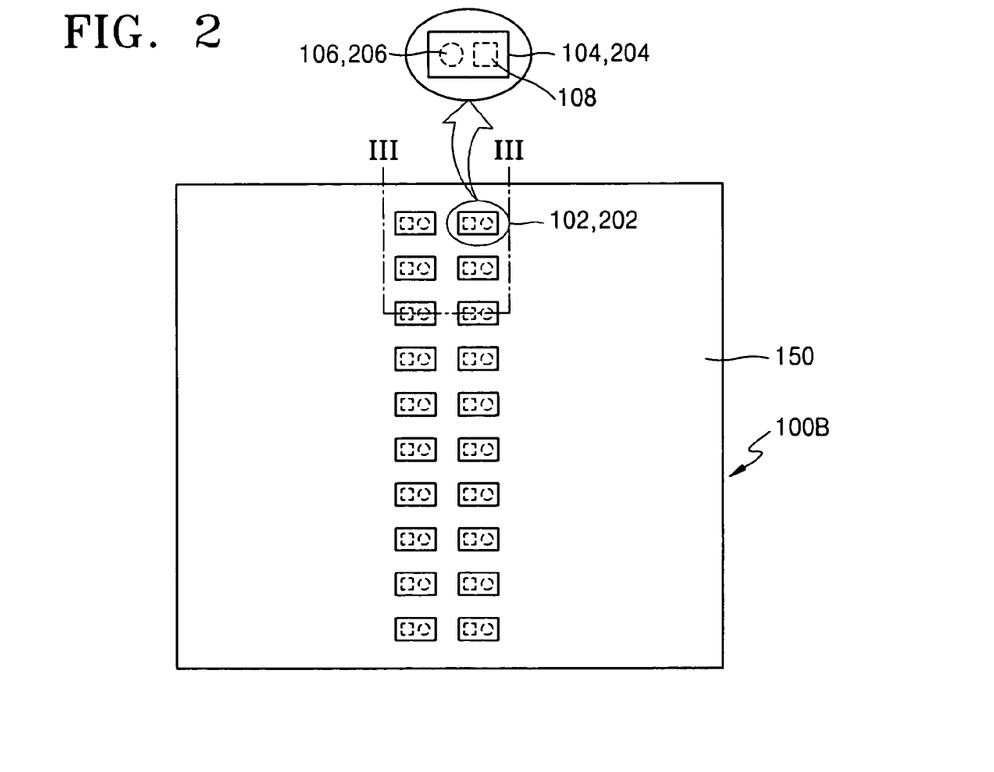

FIGS. 1 and 2 are respective plane views of semiconductor chips 100A and 100B, each having an active region 150 where circuit patterns are formed, according to embodiments of the present invention. FIG. 1 shows bond pads 108 formed along edges or the periphery of the semiconductor chip 100A, and FIG. 2 shows bond pads 108 disposed in two symmetrical lines in the center of a semiconductor chip 100B. As shown in FIGS. 1 and 2, a connection structure 102 or 202 is associated with each bond pad 108. Accordingly, the bond patterns of the semiconductor chips 100A and 100B have an associated connection structure pattern. As further shown, the connection structure 102 or 202 includes a bond extension pattern 104 or 204 and a chip perforate pattern 106 or 206.

Figure 3:
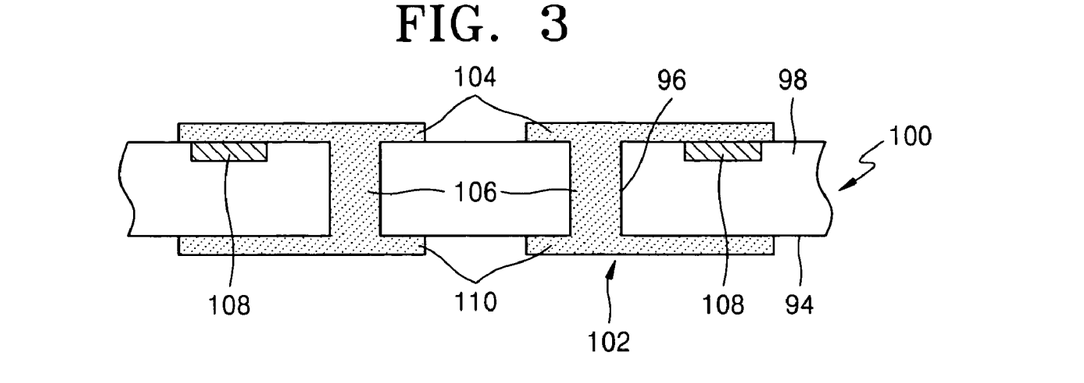
FIG. 3 is a cross-sectional view of the semiconductor chip of FIG. 2 along the line III—III showing a first connection structure according to an embodiment of the present invention.
Figure 5:
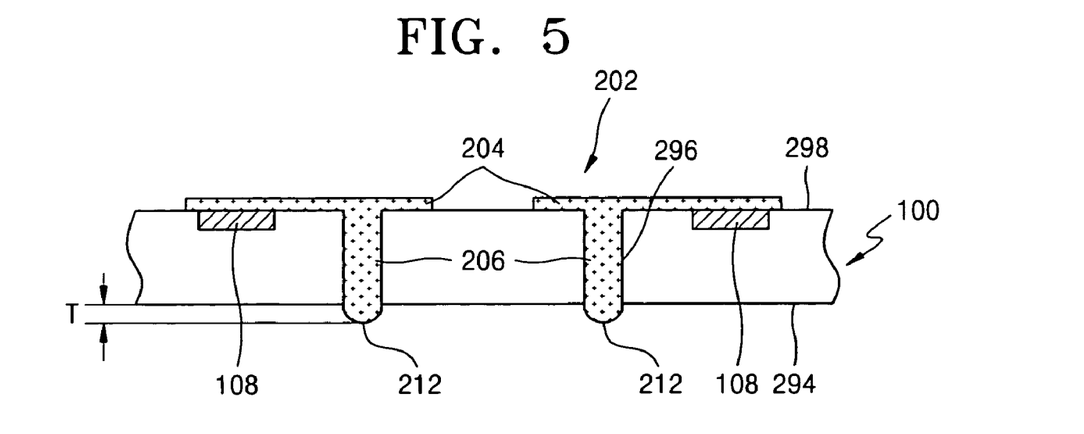
FIG. 5 is a cross-sectional view of the semiconductor chip of FIG. 2 along the line III—III showing a second connection structure according to an embodiment of the present invention.

FIGS. 3 and 5 respectively illustrate an embodiment of a first connection structure 102 and an embodiment of a second connection structure 202 according to the present invention. More specifically, FIG. 3 illustrates a cross-section of a first connection structure 102 along a line III—III in FIG. 2, and FIG. 5 illustrates a cross-section of a second connection structure 202 along the line III—III in FIG. 2. Because the first and second connection structures 102 and 202 apply to either the semiconductor chip 100A or the semiconductor chip 100B, and are not limited in application to these two types of semiconductor chips, FIGS. 3 and 5 generically illustrate the first and second connection structures 102 and 202 applied to a semiconductor chip 100.

Referring to FIG. 3, the first connection structure 102 includes a first bond pad extension pattern 104 disposed over a portion of a first surface 98 of the semiconductor chip 100 that includes the bond pad 108. The first bond pad extension pattern 104 is formed of a conductive material and is thus electrically connected to the first bond pad 108. The first bond pad extension pattern 104 extends over hole 96, which is formed through the semiconductor chip 100 from the first surface 98 to a second surface 94. The first chip perforate pattern 106 substantially fills the hole 96. The first chip perforate pattern 106 may be formed of a same conductive material as the first bond pad extension 104, and is electrically connected to the first bond pad extension pattern 104.

In this embodiment, the first connection structure 102 may also include a second bond pad extension pattern 110. The second bond pad extension pattern 110 extends across a portion of the second surface 94 that includes the hole 96. The second bond pad extension pattern 110 may be formed of the same material as the first bond pad extension pattern 104, and is electrically connected to the first chip perforate pattern 106.

Figure 4:
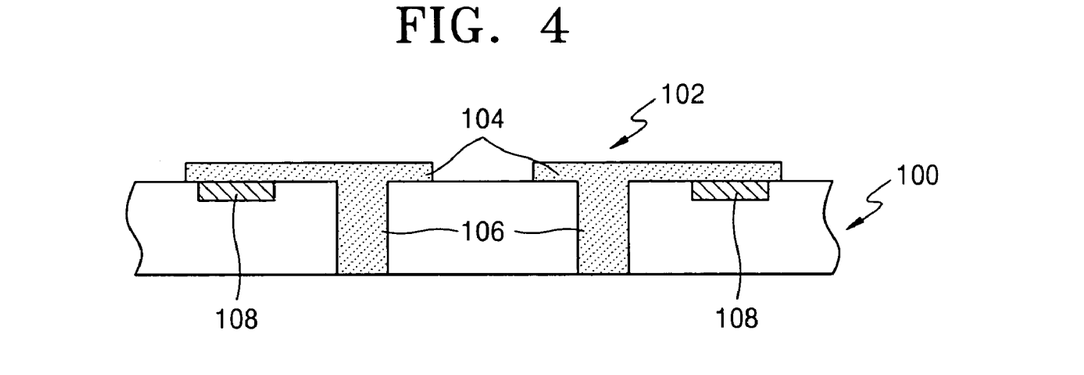
FIG. 4 is a cross-sectional view of a semiconductor chip along line III—III in FIG. 2 showing another embodiment of the first connection structure of the present invention.

Alternatively, as shown in FIG. 4, the first connection structure 102 may not include the second bond pad extension pattern 110.

The thicknesses of the first and second bond pad extension patterns 104 and 110 may be between 3 and 30 μm. In addition, the first and second bond pad extension patterns 104 and 110 and the first chip perforate pattern 106 may be formed by electroplating or by performing a reflow process after filling with a powdery solder paste.

Thus, through the first bond pad extension pattern 104, the first chip perforate pattern 106 and the second bond pad extension pattern 110, the function of the bond pad 108 extends from a first surface 98 to a second surface 94 of the semiconductor chip 100. The first bond pad extension pattern 104, the first chip perforate pattern 106 and the second bond pad extension pattern 110 may be formed of a soft metal such as Sn, SnPb, SnAg, SnAgCu, SnBi, In, and InSn. Also, the soft metal may be another material which can be easily formed in the semiconductor chip 100 and has lower hardness and melting point than those of a hard metal discussed below with respect to FIG. 5.

Referring to FIG. 5, the second connection structure 202 includes a third bond pad extension pattern 204 disposed over a portion of a first surface 298 of the semiconductor chip 100 that includes the bond pad 108. The third bond pad extension pattern 204 is formed of a conductive material and is thus electrically connected to the first bond pad 108. The third bond pad extension pattern 204 extends over a hole 296, which is formed through the semiconductor chip 100 from the first surface 298 to a second surface 294. The second chip perforate pattern 206 substantially fills the hole 296. The second chip perforate pattern 206 may be formed of a same conductive material as the third bond extension pattern 204, and is electrically connected to the third bond pad extension pattern 204. In this embodiment, the second chip perforate pattern 206 includes a protrusion part 212 extending beyond the second surface 294. At least the protrusion part 212 is formed of a harder material than the first bond pad extension pattern 104. The thickness of the protrusion part 212 may be between 3 and 50 μm. The thickness of the third bond pad extension pattern 204 may be between 3 and 30 μm. In one embodiment, the third bond extension pattern 204 and the second chip perforate pattern 206 (including the protrusion part 212) are formed of a same material harder than the material of the first connection structure 102. For example, the material of the second connection structure 202 may be a hard metal such as Cu, Ni, Ni—P, Au, and Ag.

Figure 6:
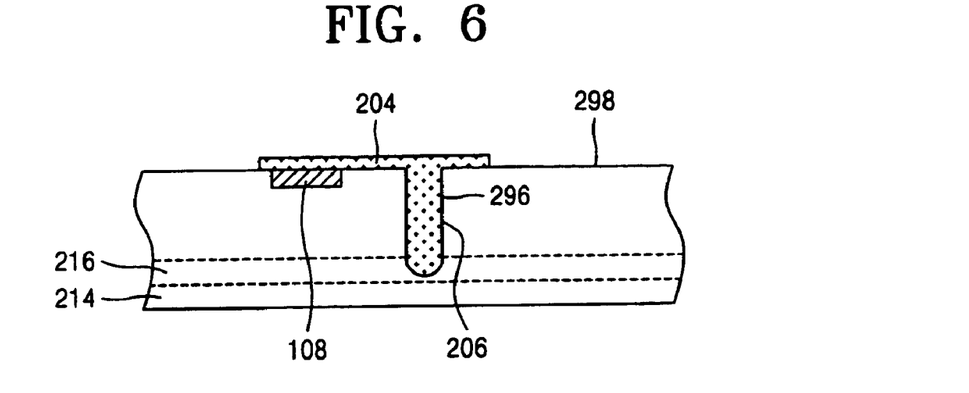
FIGS. 6 and 7 are cross-sectional views illustrating a method of manufacturing the semiconductor chip of FIG. 5 according to an embodiment of the present invention.
Figure 7:
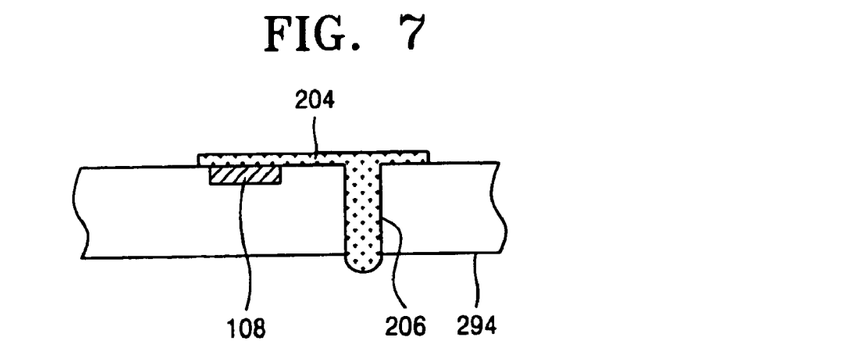

FIGS. 6 and 7 are cross-sectional views illustrating a method of manufacturing a second connection structure 202 according to an embodiment of the present invention. Referring to FIGS. 6 and 7, the hole 296 is formed in an area adjacent to the bond pad 108 by laser drilling in the semiconductor chip 100. Subsequently, the second chip perforate pattern 206 and the third bond pad extension pattern 204, which fill the hole 296, are formed of a hard metal. Next, a first layer 214 of the semiconductor chip 100 is removed by polishing or grinding. A wet etching process is performed on this side of the semiconductor chip 100, and a second layer 216 is removed so that only the protrusion part 212 is exposed and protrudes from the second surface 294 of the semiconductor chip 100. In this case, the wet etching process can be performed using an etchant having an etching selectivity of the semiconductor chip material (e.g., silicon) with respect to the hard metal used in forming the second chip perforate pattern 206.

Figure 8:
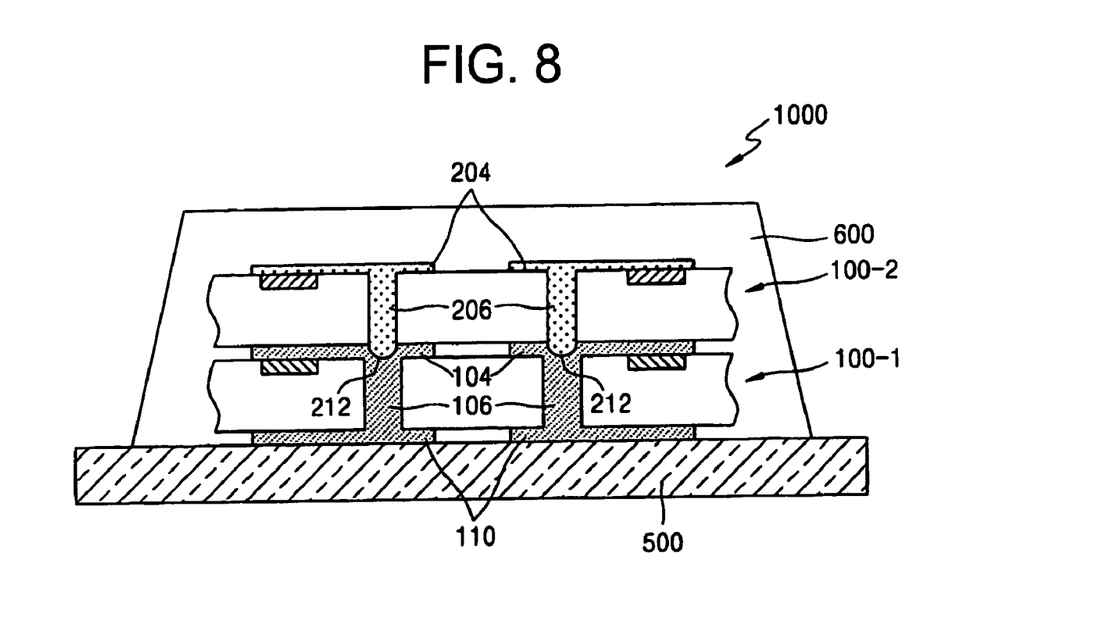
FIG. 8 is a cross-sectional view of a stacked multi-chip semiconductor package according to an embodiment of the present invention.

FIG. 8 is a cross-sectional view of a stacked multi-chip semiconductor package according to an embodiment of the present invention. Referring to FIG. 8, a stacked multi-chip semiconductor package 1000 includes a base frame 500 on which a semiconductor chip can be mounted. A first type semiconductor chip 100-1, which includes the first connection structure 102, may be mounted on the base frame 500, and a second type semiconductor chip 100-2, which includes the second connection structure 202, may be mounted on the first type semiconductor chip 100-1. In this case, a connection protrusion part 212 of the second type semiconductor chip 100-2 is electrically connected to a first bond pad extension pad 104 of the first type semiconductor chip 100. In addition, a second bond pad extension pad 110 of the first type semiconductor chip 100 is electrically connected to terminals (not shown) of the base frame 500. In this case, the connection protrusion part 212 connected to the second chip perforate pattern 206 formed of a hard metal has a large connection area with the first bond pad extension pattern 104, which is advantageous for connection reliability of semiconductor chips stacked in a vertical direction.

The base frame 500 may be a flexible printed circuit board (PCB), a lead frame, or a rigid type PCB. When the stacked multi-chip semiconductor package 1000 according to an embodiment of the present invention uses a printed circuit pattern as an external connection terminal like in an IC card, an additional external connection terminal is not needed. However, when the stacked multi-chip semiconductor package 1000 is used in a ball grid array (BGA) shape, a solder ball may be additionally attached to a PCB-shaped base frame.

In addition, the first and second type semiconductor chips 100-1 and 100-2 may be elements, which are stacked like a passive device or a semiconductor memory and increase the function of a semiconductor chip. The stacked multi-chip semiconductor package 1000 according to an embodiment of the present invention may further comprise a sealing unit 600 that protects upper portions of the first type semiconductor chip 100-1, the second type semiconductor chip 100-2, and the base frame 500. The sealing unit 600 may be an epoxy mold compound (EMC) or a metal cap or the like.

As described above, the semiconductor chips are connected to each other in the vertical direction by using hard metal and soft metal together. Thus, the connection protrusion part 212 formed of the hard metal may be buried in a first bond pad extension pattern (104 of FIG. 8) formed of the soft metal and connected to the first bond pad extension pattern 104 by a large connection area. As such, a stacked multi-chip semiconductor package in which connection reliability of adjacent semiconductor chips stacked in a vertical driection and adhesion are improved can be manufactured.

Figure 9:
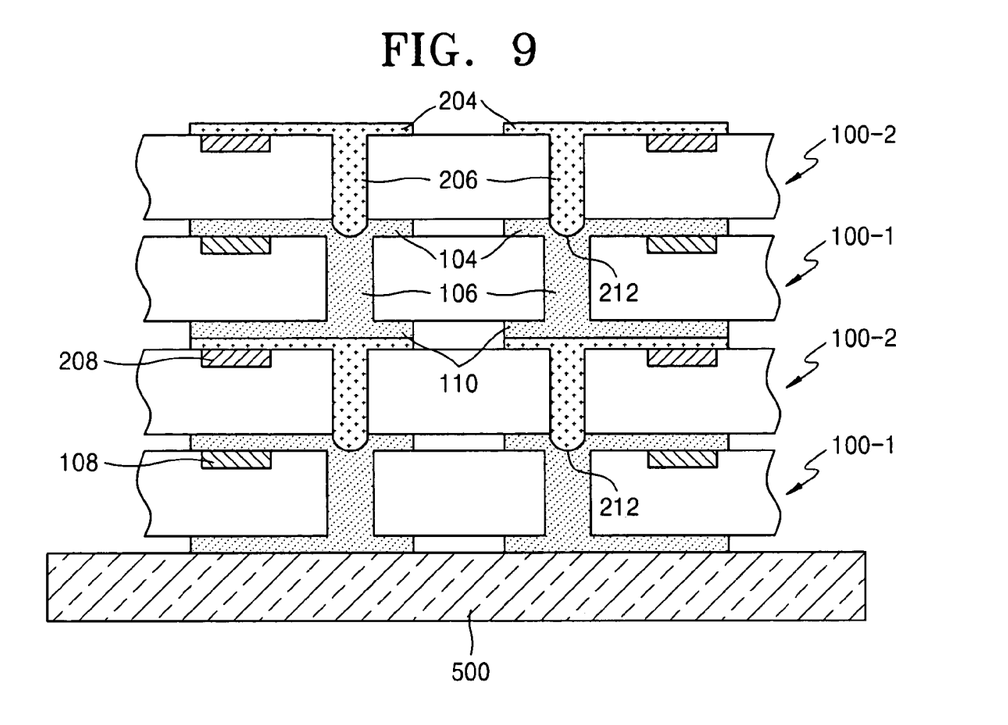
FIG. 9 is a cross-sectional view of a multi-chip semiconductor package according to a modified embodiment of the present invention.

FIG. 9 is a cross-sectional view of a multi-chip semiconductor package according to a modified embodiment of the present invention. Referring to FIG. 9, a first type semiconductor chip 100-1 and a second type semiconductor chip 100-2 are stacked on a base frame 500, and then, another first type semiconductor chip 100-1 and another second type semiconductor chip 100-2 are further stacked thereon. Since connection reliability between semiconductor chips and adhesion are improved, 6 semiconductor chips, 8 semiconductor chips, 16 semiconductor chips, etc. may be stacked and a simple packaging method is created so that, for example, the storage capacity of a semiconductor memory can be increased.

Figure 10:
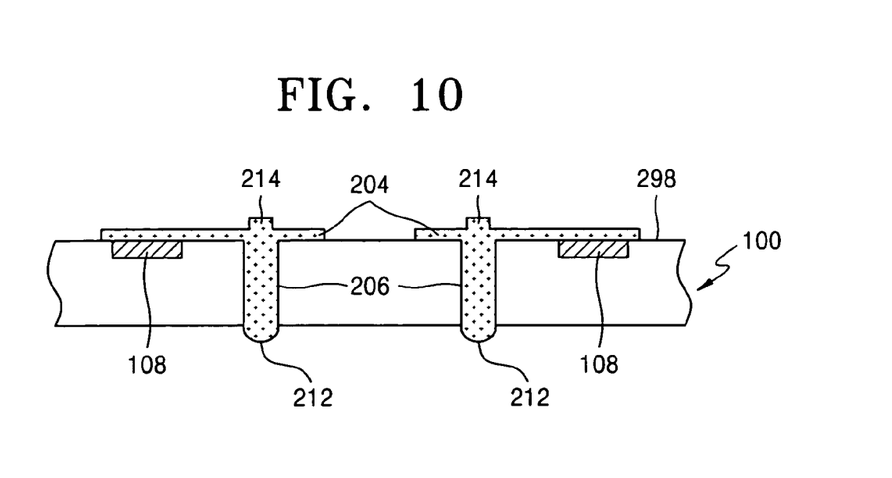
FIG. 10 is a cross-sectional view of a semiconductor chip along line III—III in FIG. 2 showing another embodiment of the second connection structure according to the present invention.
Figure 12:
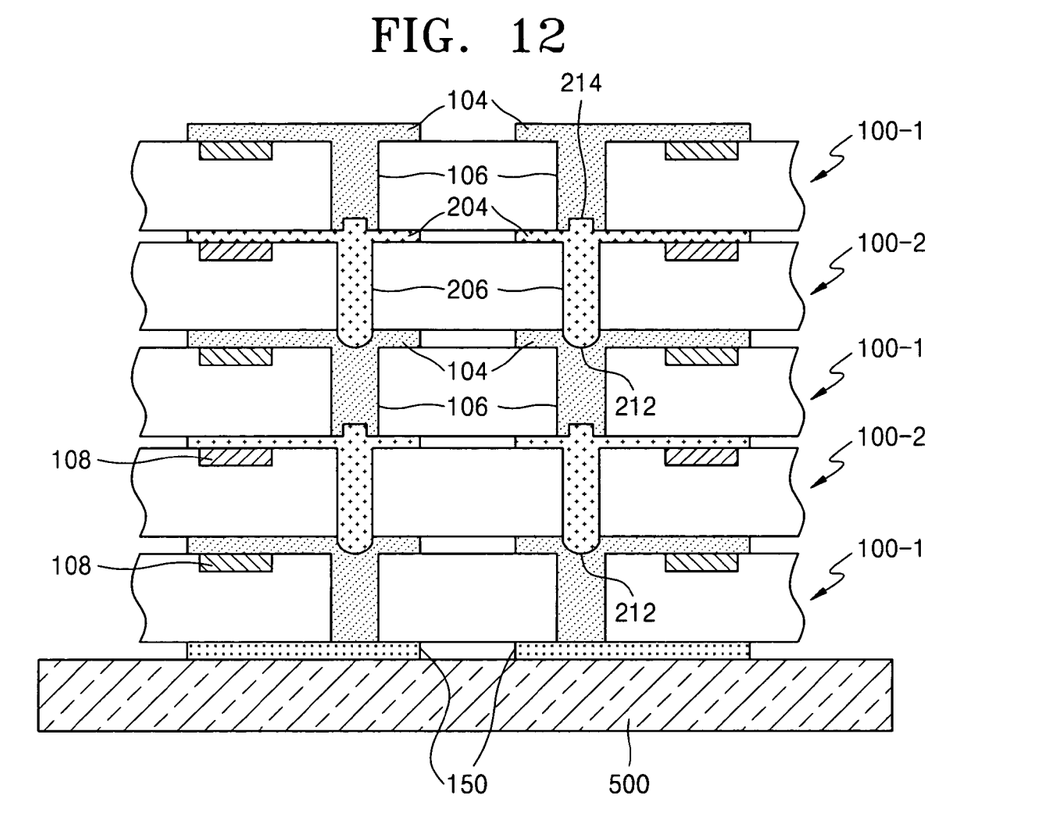
FIG. 12 is a cross-sectional view of a multi-chip semiconductor package according to a further embodiment of the present invention.

FIG. 10 is a cross-sectional view of a semiconductor chip employing a modified version of the second connection structure 202 according to an embodiment of the present invention. As shown, the second connection structure of FIG. 12 is the same as shown in FIG. 5, except that the third bond pad extension pattern 204 includes a protrusion part 214 projecting up from the first surface 298. If the number of stacked semiconductor chips is greater than 2, the insertion protrusion part 214 is inserted into a first chip perforate pattern 106 or the second bond pad extension pattern 110 of the first connection structure 102 so that connection reliability of semiconductor chips stacked in a vertical direction may be improved.

Figure 11:
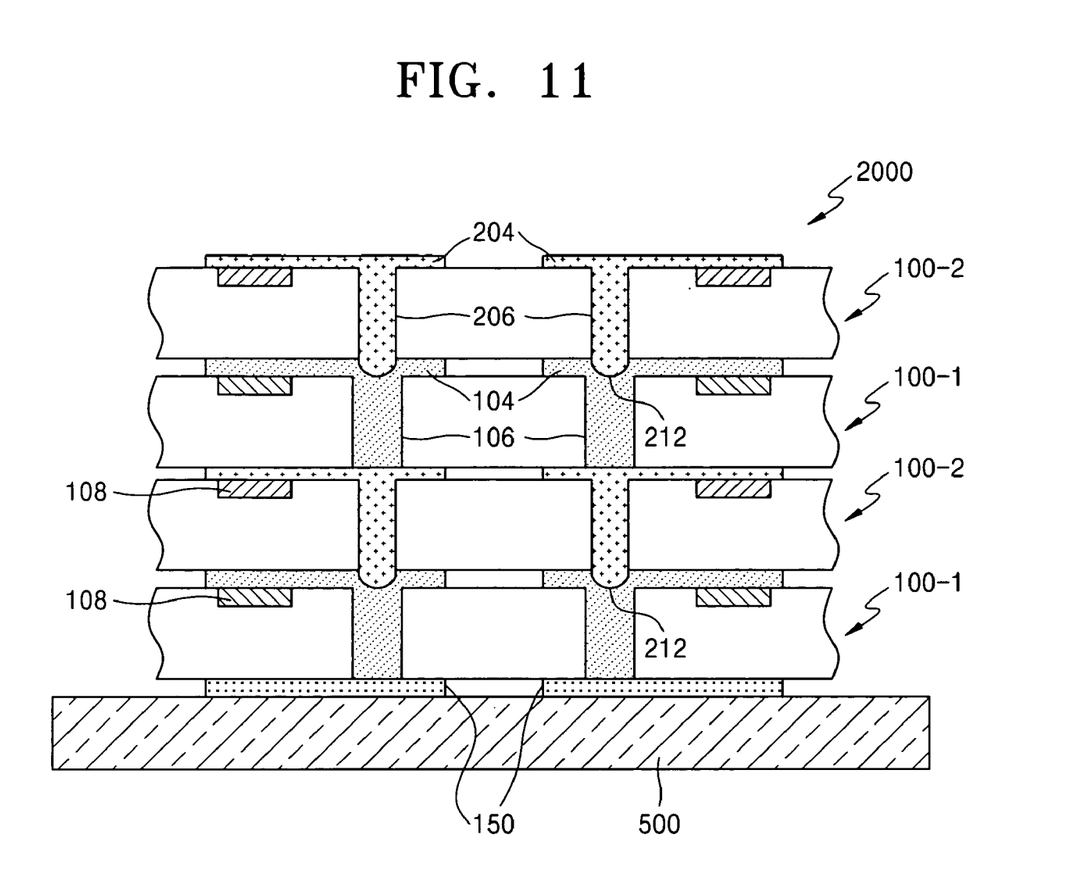
FIG. 11 is a cross-sectional view of a stacked multi-chip semiconductor package according to another embodiment of the present invention.

FIG. 11 is a cross-sectional view of a stacked multi-chip semiconductor package according to another embodiment of the present invention. Referring to FIG. 11, a stacked multi-chip semiconductor package 2000 includes a base frame 500; a first type semiconductor chip 100-1, which uses the first connection structure of FIG. 4, mounted on the base frame 500; and a second type semiconductor chip 100-2, which uses the second connection structure 202 of FIG. 5, mounted on the first type semiconductor chip 100-1.

Here, the first type semiconductor chip 100-1 may be mounted on the base frame 500 using an adhering unit 150, for example, a solder, a conductive adhesive, or an anisotropic conductive film (ACF). The adhering unit 150 electrically connects the first chip perforate pattern 106 of the first type semiconductor chip 100-1 to terminals of the base frame 500. In addition, the first type semiconductor chip 100-1 and the second type semiconductor chip 100-2 are connected to each other in such a manner that the connection protrusion part 212 of the second type semiconductor chip 100-2 is connected to the first bond pad extension pattern 104 of the first type semiconductor chip 100-1.

In order to increase the capacity of the semiconductor package 2000, one or more first type semiconductor chips 100-1 and second type semiconductor chips 100-2 may be additionally stacked. In addition, the stacked multi-chip semiconductor package 2000 according to another embodiment of the present invention may further comprise a sealing unit (not shown) that protects upper portions of the first and second type semiconductor chips 100-1 and 100-2 and the base frame 500. For example, an epoxy mold compound (EMC) or a metal cap or the like may serve as the sealing unit.

FIG. 12 is a cross-sectional view of a multi-chip semiconductor package according to a modified embodiment of the present invention. FIG. 12 is the same as FIG. 11 except that the second connection structure 202 includes the insertion protrusion part 214. The insertion protrusion part 214 may be formed by performing a photolithography process and a plating process on the third bond pad extension pattern 204. Thus, if the number of semiconductor chips is greater than 2, the insertion protrusion part 214 may be inserted into the first chip perforate pattern 106 of the first type semiconductor chip 100-1. As such, connection reliability of semiconductor chips stacked in a vertical direction can be improved.

As described above, in the stacked multi-chip semiconductor package according to the present invention, a first type semiconductor chip having a connection structure made of a soft material such as soft metal and a second type semiconductor chip having a connection structure made of a hard material such as hard metal are alternately stacked to form a stacked semiconductor package such that connection reliability of adjacent semiconductor chips stacked in a vertical direction can be improved and adhesion can be improved.

While this invention has been particularly shown and described with reference to exemplary embodiments thereof, it will be understood by those skilled in the art that various changes in form and details may be made therein without departing from the spirit and scope of the invention.

The invention claimed is:

1. A stacked semiconductor chip package, comprising:
a first semiconductor chip having a first connection structure, the first connection structure electrically connected to a bond pad on a first surface of the first semiconductor chip; and
a second semiconductor chip having a second connection structure, the second connection structure electrically connected to a bond pad on a first surface of the second semiconductor chip and extending through the second semiconductor chip to a second surface of the second semiconductor chip, a portion of the second connection structure extending to the second surface of the second semiconductor chip being electrically connected to the first connection structure and formed of a harder material than the first connection structure.

2. The chip package of claim 1, further comprising:
a base frame; and wherein
the first connection structure extends through the first semiconductor chip to a second surface of the first semiconductor chip, and the first connection structure is electrically connected to the base frame.

3. The chip package of claim 2, further comprising:
an adhering unit electrically connecting the first connection structure to the base frame.

4. The chip package of claim 3, wherein the adhering unit is one of a solder, a conductive adhesive, and an anisotropic conductive film.

5. The chip package of claim 2, wherein a portion of the first connection structure extends across a portion of the second surface of the first semiconductor chip and the portion of the first connection structure is electrically connected to the base frame.

6. The chip package of claim 2, wherein the base frame is a lead frame.

7. The chip package of claim 2, wherein the base frame is a printed circuit board.

8. The chip package of claim 1, wherein the first connection structure includes one of Sn, SnPb, SnAg, SnAgCu, SnBi, In and InSn.

9. The chip package of claim 1, wherein the second connection structure includes one of Cu, Ni, Ni—P, Au, and Ag.

10. The chip package of claim 1, wherein part of the portion of the second connection structure extending to the second surface of the second semiconductor chip protrudes from the second surface of the second semiconductor chip.

11. The chip package of claim 10, wherein a portion of the protruding part extends into the first connection structure.

12. The chip package of claim 10, wherein the protruding part protrudes from the second surface of the second semiconductor chip by 3–50 um.

13. The chip package of claim 1, wherein the first connection structure on the first surface of the first semiconductor chip and the second connection structure on the first surface of the second semiconductor chip each have a thickness of between 3–30 um.

14. The chip package of claim 1, further comprising:
a sealing unit protecting the first and second semiconductor chips.

15. The chip package of claim 14, wherein the sealing unit is one of an epoxy mold compound and a metal cap.

16. The chip package of claim 1, further comprising:
additional semiconductor chips stacked on the second semiconductor chip, each additional semiconductor chip having one of the first and second connection structures.

17. The chip package of claim 16, wherein the additional semiconductor chips alternate between having the first and second connection structures.

18. The chip package of claim 16, wherein a portion of the second connection structure on the first surface of the second semiconductor chip projects up from the first surface of the second semiconductor chip.

19. The chip package of claim 1, wherein a portion of the second connection structure on the first surface of the second semiconductor chip projects up from the first surface of the second semiconductor chip.

20. The chip package of claim 1, wherein
the first connection structure includes a first bond pad extension pattern and a first chip perforate pattern, the first bond pad extension pattern electrically connected to the bond pad on the first surface of the first semiconductor chip, the first chip perforate pattern electrically connected to the first bond pad extension pattern and extending through the first semiconductor chip to the second surface of the first semiconductor chip; and
the second connection structure including a third bond pad extension pattern and a second chip perforate pattern, the third bond pad extension pattern electrically connected to the bond pad on the first surface of the second semiconductor chip, the second chip perforate pattern electrically connected to the second bond pad extension pattern and extending through the second semiconductor chip to the second surface of the second semiconductor chip, and the second perforate pattern being electrically connected to the first bond pad extension pattern and formed of a harder material than the first bond pad extension pattern.

21. The chip package of claim 20, wherein the first connection structure includes a third bond pad extension pattern electrically connected to the first chip perforate pattern and extending across a portion of the second surface of the first semiconductor chip.

22. The chip package of claim 1, wherein the first semiconductor chip includes bond pads disposed along a periphery of the first semiconductor chip and the second semiconductor chip includes bond pads disposed along a periphery of the second semiconductor chip.

23. The chip package of claim 1, wherein the first semiconductor chip includes bond pads disposed along a center of the first semiconductor chip and the second semiconductor chip includes bond pads disposed along a center of the second semiconductor chip.

24. A stacked semiconductor chip package, comprising:
a first semiconductor chip having a first connection structure, the first connection structure electrically connected to a bond pad on a first surface of the first semiconductor chip; and
a second semiconductor chip having a second connection structure, the second connection structure electrically connected to a bond pad on a first surface of the second semiconductor chip and extending through the second semiconductor chip to a second surface of the second semiconductor chip, a portion of the second connection structure protruding from the second surface of the second semiconductor chip, and a portion of the protruding portion extending into the first connection structure such that the first and second connection structures are electrically connected.

* * * * *